(12) United States Patent
Rautio et al.

(10) Patent No.: US 11,528,802 B2
(45) Date of Patent: Dec. 13, 2022

(54) INTEGRATED FUNCTIONAL MULTILAYER STRUCTURE AND METHOD OF MANUFACTURE THEREFOR

(71) Applicant: TACTOTEK OY, Oulunsalo (FI)

(72) Inventors: Tapio Rautio, Oulunsalo (FI); Tomi Simula, Oulunsalo (FI); Minna Pirkonen, Oulunsalo (FI); Jarkko Torvinen, Oulunsalo (FI); Tuukka Junkkari, Oulunsalo (FI); Janne Asikkala, Oulunsalo (FI); Hasse Sinivaara, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 16/724,631

(22) Filed: Dec. 23, 2019

(65) Prior Publication Data

US 2021/0195731 A1   Jun. 24, 2021

(51) Int. Cl.
*H05K 1/02* (2006.01)

(52) U.S. Cl.
CPC .................. *H05K 1/0277* (2013.01)

(58) Field of Classification Search
CPC .......... H05K 1/00; H05K 1/02; H05K 1/0271; H05K 1/0277; H05K 1/0278; H05K 1/028;

(Continued)

(56) References Cited

U.S. PATENT DOCUMENTS 2,452,349 A * 10/1948 Howard .................. H01Q 3/12
                                                          342/158
5,434,362 A *  7/1995 Klosowiak .......... H05K 1/0281
                                                          174/254

(Continued)

FOREIGN PATENT DOCUMENTS

CN      108235557 A  *  6/2018
EP      0477981 A2      4/1992

(Continued)

OTHER PUBLICATIONS

Machine translation (Google patents) of CN 108235557 A. Translated Jun. 21, 2021. (Year: 2021).*

(Continued)

*Primary Examiner* — Maria V Ewald
*Assistant Examiner* — Ethan A. Utt
(74) *Attorney, Agent, or Firm* — Robert P. Michal, Esq.; Carter, DeLuca & Farrell LLP

(57) ABSTRACT

A method of manufacture and an integrated functional multilayer structure, includes a substrate film formed or formable so as to exhibit a selected shape; and a number of functional, preferably including optical, mechanical, optoelectrical, electrical and/or specifically, electronic, elements, such as conductors, insulators, components and/or integrated circuits, provided upon the substrate film in the proximity of the shape; wherein the substrate film has further been provided with a structural tuning element, optionally including an elongated, circumferential or other selected shape, said structural tuning element being configured to locally control induced deformation, optionally including stretching, bending, compression and/or shearing, of the substrate film within said proximity of the shape.

27 Claims, 7 Drawing Sheets

(58) Field of Classification Search
CPC ...... H05K 1/0281; H05K 1/0284; H05K 1/03;
H05K 1/0306; H05K 1/0313; H05K
1/032; H05K 1/0326; H05K 1/0346;
H05K 1/0353; H05K 1/036; H05K
1/0366; H05K 1/0373; H05K 1/038;
H05K 1/0386; H05K 1/0393; H05K 1/05;
H05K 1/053; H05K 1/056; H05K 1/09;
H05K 1/092; H05K 1/095; H05K 1/097;
Y10T 428/24628; Y10T 428/24636; Y10T
428/24479; Y10T 428/2457; Y10T
428/24587; Y10T 428/24612; Y10T
428/24488; Y10T 428/24496; Y10T
428/24504; Y10T 428/24512; Y10T
428/24521; Y10T 428/24529; Y10T
428/24537; Y10T 428/24545; Y10T
428/24554; Y10T 428/24562; Y10T
428/24579; Y10T 428/24595; Y10T
428/24603; Y10T 428/2462; Y10T
428/24645; Y10T 428/24653; Y10T
428/24661; Y10T 428/24669; Y10T
428/24678; Y10T 428/24686; Y10T
428/24694; Y10T 428/24702; Y10T
428/24711; Y10T 428/24719; Y10T
428/24727; Y10T 428/24736; B32B 3/00;
B32B 3/26; B32B 3/263; B32B 3/28;
B32B 3/30; B32B 1/00; B32B 1/04;
B32B 1/06; B32B 2457/00; B32B
2457/08; B32B 3/02; B32B 3/08; B32B
3/085; B32B 3/10; B32B 3/12; B32B
3/14; B32B 3/16; B32B 3/18; B32B 3/20;
B32B 3/22; Y10S 428/901

USPC ............... 174/68.1, 250, 255–268, 110 R,
174/120 R–110 E; 428/156–187, 901
See application file for complete search history.

(56) References Cited

U.S. PATENT DOCUMENTS

| | | | |
|---|---|---|---|
| 6,319,012 | B1 | 11/2001 | Moessinger et al. |
| 9,521,748 | B1 * | 12/2016 | Bergman ............ H05K 1/0271 |
| 2005/0253235 | A1 * | 11/2005 | Hara .................... H01L 23/562 |
| | | | 257/678 |
| 2005/0263875 | A1 * | 12/2005 | Fumo ...................... H05K 3/28 |
| | | | 257/701 |
| 2008/0179584 | A1 * | 7/2008 | Lung ...................... H01L 45/06 |
| | | | 257/4 |
| 2015/0282304 | A1 | 10/2015 | Ely et al. |
| 2016/0056091 | A1 | 2/2016 | Kim et al. |
| 2016/0105950 | A1 * | 4/2016 | Drzaic ................ H05K 3/0014 |
| | | | 156/196 |
| 2018/0149321 | A1 * | 5/2018 | Torvinen ................ H05K 1/181 |

FOREIGN PATENT DOCUMENTS

| | | | | |
|---|---|---|---|---|
| EP | 1968360 | A1 * | 9/2008 | .......... H05K 1/0281 |
| WO | WO-2018152672 | A1 * | 8/2018 | .......... H05K 3/0097 |

OTHER PUBLICATIONS

Machine translation (Espacenet) of CN 108235557 A. Translated Sep. 20, 2021. (Year: 2021).*
International Search Report and Written Opinion for application No. PCT/FI2020/050850 dated Apr. 6, 2021.
International Preliminary Report on Patentability dated Mar. 31, 2022, issued in corresponding International Application No. PCT/FI2020/050850, 8 pages.

* cited by examiner

600

700

800

900

1000

1200   1202

1300

INTEGRATED FUNCTIONAL MULTILAYER STRUCTURE AND METHOD OF MANUFACTURE THEREFOR

FIELD OF THE INVENTION

The present invention relates in general to functional, integrated structures incorporating functional features such as electronic, mechanical or optical elements. In particular, however not exclusively, the present invention concerns situations wherein a substrate layer of the structure is subjected to processing activities causing deformation thereof.

BACKGROUND

There exists a variety of different stacked assemblies and multilayer structures in the context of different functional ensembles e.g. in the field of electronics and electronic products. The motivation behind the integration of functionalities involving e.g. electronics, mechanical or optical features may be as diverse as the related use contexts. Relatively often size savings, weight savings, cost savings, or just efficient integration of components is sought for when the resulting solution ultimately exhibits a multilayer nature. In turn, the associated use scenarios may relate to product packages or casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not always the case.

Furthermore, the concept of injection molded structural electronics (IMSE) involves building functional devices and parts therefor in the form of a multilayer structure, which encapsulates electronic functionality as seamlessly as possible. Characteristic to IMSE is also that the electronics is commonly manufactured into a true three-dimensional (3D) (non-planar) form in accordance with the 3D models of the overall target product, part or generally design. To achieve desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired three-dimensional, i.e. 3D, shape and subjected to overmolding, for example, by suitable plastic material that covers and embeds the underlying elements such as electronics, thus protecting and potentially hiding the elements from the environment. Further layers and elements may be naturally added to the construction.

When producing or mounting elements such as mechanical, optical or electrical—if not specifically electronic—components onto e.g. a film-type substrate, such as a thermoplastic film, a piece of fabric or a leather sheet, the substrate or surrounding other layers at least indirectly connected to the elements may be later subjected to forces involving e.g. twisting, stretching, compression or bending, which may cause the elements—if not the substrate itself—to break or detach from the attached elements.

In connection with elements such as electronics packages (e.g. thin quad flat package (TQFP)) or other components, which arguably have many preferred properties such as a rather manageable contact density from the standpoint of e.g. IMSE technology, it has been further found that such elements easily trap air underneath them during various processing stages such as overmolding, which may in turn reduce the factual size of associated contact areas.

Yet, directly embedding e.g. TQFP and other packages, or generally elements, as is in hard resins has not been found fully applicable approach especially in scenarios involving wide temperature ranges due to a large coefficient of thermal expansion (CTE) mismatch between the concerned features, which may eventually cause the structure to tear apart and fail. Larger packages or elements can also be challenging in certain processing stages such as forming (e.g. thermoforming) of a hosting substrate film as the related contacts may be torn and lost.

When there is a drastic change in a structure's rigidity, considering e.g. locations on the substrate film at the edge of a potentially underfilled element such as a component or module, large transients of film deformation, caused by e.g. stretch during thermoforming, may emerge, which in turn causes excessive stress to neighboring potentially more fragile materials such as layers of insulating, conductive and/or colored ink.

Generally, when elements such as conductor traces or related crossover structures are positioned near drastic-type radius in terms of a surface contour of a hosting substrate film, the elements may tear and fail. For example, conductive ink used in crossovers may be more brittle than standard conductive ink, which increases the risk of failure in the vicinity of e.g. insulator boundary and considerable curvature of the substrate. Insulator print is often more resistant to stretching, thus causing a transient in deformation at its edges, most importantly in places where insulator ends and the overlying crossover conductive ink is connected to more standard conductive ink.

Still further, in scenarios wherein large features such as shielding hatches or antennae are to be established on 3D (substrate) surfaces from a stiffer material such as conductive ink (in contrast to substrate such as a plastic film itself), the stiffer material may cause undesired effects such as deformation, folding or even tear in the surrounding features on the film and in the film itself, thus potentially ruining the workpiece.

SUMMARY

The objective of the present invention is to at least alleviate one or more of the drawbacks associated with the known solutions in the context of integral structures where at least some of the included or to-be-included features, such as a substrate (film), are subjected to deformation inducing forces during the processing or manufacturing of the structure, installing the structure or using the structure, for example.

The objective is achieved with various embodiments of an integrated functional multilayer structure and a related method for providing an integrated functional multilayer structure.

According to a first aspect, an integrated functional multilayer structure is provided. The multilayer structure comprises a substrate film formed or formable (optionally thermoformed) so as to exhibit a selected, preferably three-dimensional non-flat, shape. Furthermore, the multilayer structure comprises a number of functional, preferably including e.g. optical, mechanical, optoelectrical, electrical and/or specifically, electronic, elements, such as conductors, for example traces or 'wiring', insulators, components and/or integrated circuits, provided upon the substrate film in the proximity of the formed non-flat shape. The substrate film has further been provided with a structural tuning element, optionally comprising or defining an elongated, circumferential, and/or other selected shape(s). Said structural tuning element is configured to locally control e.g. process-induced such as forming-induced deformation, optionally including stretching, bending, compression and/or shearing, of the substrate film within said proximity of the shape comprising or consisting of, for example, a formed non-flat shape. The structural tuning element may include, for example, electrically conductive material (e.g. conductive ink) or electrically insulating material (e.g. insulating ink or e.g. plastic/polymer, ceramics or glass). The tuning element may generally be mountable or printable, for example.

A substrate film included in the multilayer structure may refer to an element in which one (e.g. z, such as "thickness") of the three dimensions is significantly shorter with respect to the other two (e.g. x and y) dimensions, for example. The substrate film may be flexible and bendable at least in places. However, it may be originally flat.

In preferable embodiments, the multilayer structure further may comprise a plastic, optionally thermoplastic, layer produced, optionally molded, such as injection molded, or cast, upon the substrate film and embedding at least portion of the number of functional elements and/or of the structural tuning element therewithin.

In various embodiments, the substrate film may define or at least locally comprise a 3D, preferably thermoformed, non-flat shape and the structural tuning element may be configured to control the deformation of the substrate within a proximity of the 3D non-flat shape, preferably comprising the control over the distribution of deforming forces in selected directions.

Yet, one or or more of the functional element(s) may include e.g. a sub-assembly with an own substrate ("sub-substrate") and elements such as electrical or specifically electronic components hosted by the (sub-)substrate, such as an electrical node.

In various embodiments, instead of or in addition to arranging a functional element, such as an electrical element, upon the substrate film such that it substantially projects from any side of the substrate film, the functional element may be provided in a recess, blind-hole or a through-hole established in the substrate film. A recess may be obtained, for example, by forming, such as thermoforming, of the substrate film either upfront or subsequent to the provision of the functional element thereon, for example, so that a recess shape is defined by the substrate film. A hole such as a through-hole or a blind-hole may be obtained, for example, by removing substrate material or directly establishing the substrate from a concerned source material (by molding, for example) so as to the define the hole, for instance. Accordingly, the element may be at least partially accommodated by the recess or hole of the substrate in such a manner that it does not protrude at all or at least considerably or fully from the substrate film. A smaller recess may still remain at the location of the element, partially filled by the element and, optionally, molded or cast material layer or other feature. The substrate film may be provided with a flush first surface by embedding the functional element(s) therein.

In various embodiments, the structural tuning element may be located in contact with or adjacent to at least one of the number of functional elements.

In various embodiments, the structural tuning element may, alternatively or in addition, be configured to locally limit, reduce or increase deformation of the substrate film.

In various embodiments, the structural tuning element may, alternatively or in addition, be configured to limit, reduce or increase the slope of deformation, limit, reduce or increase the magnitude of changes in the slope, shift the deformed area, shape the deformed area, limit, reduce or increase the magnitude of deformation, and/or extend or reduce the length of deformed area or transition between the deformed area and neighboring, optionally substantially flat, substrate portion(s).

In various embodiments, the structural tuning element may, alternatively or in addition, comprise first material that is stiffer and preferably also more tear resistant, or vice versa, than second material included in of the substrate, of any material layer thereon, or in of any of the functional elements.

In various embodiments, the structural tuning element may, alternatively or in addition, comprise an optionally printed, electrically preferably insulating or conductive, element configured to reduce and/or shift away deformation-caused slope and/or transition area of the substrate film at the location of at least one functional element of the number of functional elements, wherein the electrically preferably insulating or conductive element is optionally integral with or adjacent to an electrically insulating or conductive cross-over element such as a crossover print, further optionally establishing an extension of the crossover element.

In various embodiments, the structural tuning element may, alternatively or in addition, comprise at least a portion configured to extend and optionally expand or reduce towards the maximum of deformation or related slope from the functional element.

In various embodiments, the structural tuning element may, alternatively or in addition, comprise or essentially or merely consist of at least one element selected from the group consisting of: mechanical element, optically functional element, printed electronics technology-provided element, electrically insulating element, electrically conductive element, printed electronics-provided electrically insulating element, printed electronics-provided electrically conductive element, additively produced element, sputtered element, deposited element, vacuum deposited element, etched element, additively produced electrically conductive element, additively produced electrically insulating element, carved element, thinned or thickened portion of a greater element such as of an electrically conductive element or an electrically insulating element, cavity, recess, through-hole, subtractively produced element, subtractively produced electrically conductive element, subtractively produced electrically insulating element, physical extension of an electrically conductive element such as conductor trace or contact pad, physical extension of an electrically insulating element such as insulator fill or electrical crossover insulation layer, and optically functional such as transmissive, refractive, diffractive, opaque, absorptive, scattering or reflective element.

In various embodiments, the structural tuning element may, alternatively or in addition, comprise at least a portion of frame circumferential to any of the functional elements on the substrate film, said at least portion of the frame optionally comprising electrically conductive material such as conductive ink, silver ink, dielectric ink or other electrically insulating material, color ink, adhesive and/or SMD adhesive.

In various embodiments, the structural tuning element may, alternatively or in addition, be further configured to direct, limit or prevent a flow of material, optionally underfill, conductive adhesive, conductive or insulating ink, wetting agent, surface energy affecting substance, or glob-top material, disposed in a flowable state on the substrate film or any of the functional elements, optionally so as to remain within a circumferential boundary zone defined by the structural tuning element. The zone may have a selected shape, area and/or volume as at least partially defined by the tuning element. The material of the tuning element may in this and other embodiments be thus configured to define e.g. guiding structure(s) such as wall(s), conduit(s), groove(s), and/or receptacle(s) for the desired control function of target material flow.

In various embodiments, the structural tuning element may, alternatively or in addition, comprise a frame, optionally a snap-on or printed frame, connected or at least adjacent to at least one functional element of the number of functional elements, optionally e.g. to an electronics package, mechanical or optical element.

The multilayer structure, the tuning element and/or specifically e.g. the aforesaid frame may optionally further comprise at least one element selected from the group consisting of: adhesive between the substrate film and the functional element, a spacer between the substrate film and the functional element, mechanical barrier element, optical barrier element, electrically insulating barrier element, barrier element between electrically conductive portions or elements on the substrate film and/or the functional element, viscous conductive adhesive placed on conductive portions such as leads of the functional element, preferably low-viscosity capillary flowable underfill between the substrate film and the aggregate of the frame and the functional element, and embedding material layer such a glob-top layer over at least the aggregate of the frame and the functional element.

When the tuning element defines a guiding structure, such as a conduit or receptacle, for flowable material such as conductive adhesive, ink, solder, wetting agent, surface energy affecting substance and/or underfill material, the guiding structure may be especially configured to enable the flowable material, in its flowing state, to contact with a functional element of the number of functional elements and preferably to flow towards or away from the functional element subsequent to the element's provision upon or adjacent to the guiding structure.

In various embodiments, the structural tuning element may, alternatively or in addition, comprise a mechanical stress relief structure, preferably comprising a plurality of fins, teeth and/or gradually expanding or reducing extension shapes.

In various embodiments, the structural tuning element may, alternatively or in addition, comprise an optionally (printed electronics technology) printed pattern. The pattern may be defined by or at least incorporate a plurality of e.g. non-linear or only piece-wise linear and/or non-continuous, preferably repeating and/or alternating, shapes, optionally comprising chevrons, wherein the area span by the pattern optionally defines an electromagnetic shielding or antenna radiating such as antenna structure.

In various embodiments, the structural tuning element may, alternatively or in addition, comprise an optionally printed gradient pattern with a number of repeating geometric shapes the size and/or other characteristic of which is gradually altered in the pattern, or a diffuser pattern with substantially uniform shapes.

Furthermore, in some embodiments, the pattern may be configured for light controlling such as directing, processing or coupling, optionally incoupling or outcoupling relative to the substrate film or an element thereon.

According to a second aspect, a method of producing an integrated multilayer structure is provided. The method comprises:
  obtaining a substrate film comprising formable, optionally thermoformable, material;
  providing a number of functional elements, including at least one functional element, on the substrate film; and
wherein the substrate film is further provided, preferably within a proximity of any of said functional elements, with a structural tuning element configured to locally control process-inducible deformation of the substrate.

In various embodiments, the method may further comprise forming the substrate film to exhibit a selected deformation, optionally comprising three-dimensional non-flat shape, in the proximity of the functional elements.

In various embodiments of the method, the structural tuning element may be arranged to control the deformation of the substrate within a proximity of the three-dimensional non-flat shape, preferably comprising the control over the distribution of deforming forces during the non-flat shape-inducing deformation of the substrate film.

In various embodiments, the method may, alternatively or in addition, comprise producing, preferably by molding, such as injection molding, or casting, a plastic layer upon the substrate film, at least partially embedding one or more of the functional elements and/or the structural tuning element.

For example, a film-like and/or receptacle type mold, preferably being reusable or disposable, may be utilized to accommodate and shape the material of the molding material layer during solidification, wherein the mold optionally comprises at least one element selected from the group consisting of: metal, plastic, fibrous, wood, textile or fabric, lignin, ceramic and sacrificial material. In some embodiments, at least portion such as a layer of the mold could establish a portion of a finished structure as well, e.g. a (protective) layer thereon.

In various embodiments of the method, the structural tuning element may, alternatively or in addition, be provided to the substrate film utilizing at least one technique selected from the group consisting of: additive manufacturing technique, printing preferably utilizing a selected printed electronics technology, mounting, sputtering, deposition, and subtractively processing such as etching, cutting or carving the substrate film or an element thereon.

The present invention provides different advantages over a great variety of known solutions, naturally depending on each particular embodiment thereof. One major advantage is that various embodiments of the present invention allow more complex and more reliable IMSE designs because the deformation of the substrate can be better, such as more accurately, controlled in terms of e.g. location and extent. The enhanced control of the deformation in various embodiments of the present invention yields that e.g. the functional elements such as fragile components are not being damaged and/or dismounted, for instance.

Various other advantages will become clear to a skilled person based on the following detailed description of some embodiments of the invention.

The expression "a number of" may herein refer to any positive integer starting from one (1).

The expression "a plurality of" may refer to any positive integer starting from two (2), respectively.

The terms "first", "second", "third" and "fourth" are herein used to distinguish one element from other element(s), and not to specially prioritize or order them, if not otherwise explicitly stated.

The exemplary embodiments of the present invention presented herein are not to be interpreted to pose limitations to the applicability of the appended claims. The verb "to comprise" is used herein as an open limitation that does not exclude the existence of also un-recited features. The features recited in various embodiments and e.g. dependent claims are mutually freely combinable unless otherwise explicitly stated.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF FIGURES

Some embodiments of the invention are illustrated by way of example, and not by way of limitation, in the figures of the accompanying drawings.

DETAILED DESCRIPTION OF SOME EMBODIMENTS

Figure 1:
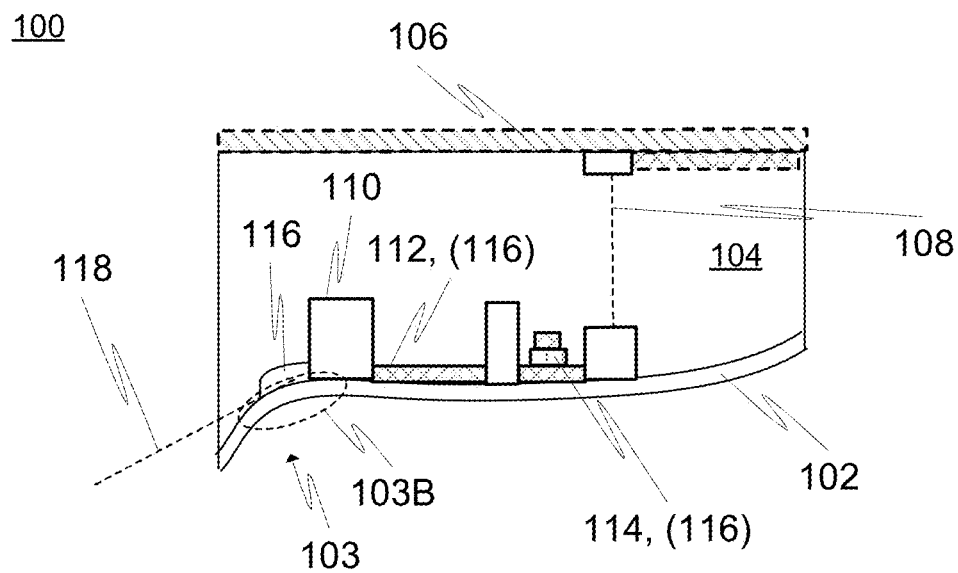
FIG. 1 illustrates an embodiment of a multilayer structure in accordance with the present invention.

FIG. 1 illustrates an embodiment of a multilayer structure 100, such as of an integrated functional multilayer structure 100, in accordance with the present invention. The structure 100 may itself establish an end product such as an electrical or electronic device or be connected to or installed at such after manufacturing, for example.

The multilayer structure 100 may comprise a substrate film 102, such as a flexible substrate film, formed or formable so as to exhibit a selected shape 103, for example, a 3D shape such as a bend, recess, protrusion, etc. The structure 100 may preferably further comprise a number of functional, preferably including optical, mechanical, optoelectrical, electrical and/or specifically, electronic, elements 110, 112, 114, such as conductors 112, insulators 114, components 110 and/or integrated circuits 110, provided upon the substrate film 102 in the proximity of the shape 103. The substrate film 102 may have further been provided with a structural tuning element 116 or elements 116, optionally, comprising elongated, circumferential or other selected shape(s). The structural tuning element(s) 116 may be configured to locally, that is e.g. essentially at transition area 103B, control (limit or reduce, for example) induced deformation such as (thermo)forming, other process or use time-induced deformation, optionally including stretching, bending, compression and/or shearing, of the substrate film 102 within the aforesaid proximity of the shape 103. For example, such control could be preferred to avoid a functional element 110 to break, detach or otherwise get disturbed by the shape 103. As shown in FIG. 1, the structural tuning element 116 may be at least partially located within the transition area introduced by the shape 103 to the substrate film 102. The functional element 110 may be considered to reside within the transition area 103B (at the edge thereof) or at least adjacent to it.

In various additional or supplementary embodiments, at least some of the number of functional elements, such as of conductors and/or connection/contact elements, such as pads, comprise at least one material selected from the group consisting of: conductive ink, conductive nanoparticle ink, copper, steel, iron, tin, aluminum, silver, gold, platinum, conductive adhesive, carbon fiber, alloy, silver alloy, zinc, brass, titanium, solder, and any component thereof. The used conductive materials may be optically opaque, translucent and/or transparent at desired wavelengths, such as visible light, so as to mask or let the radiation such as visible light to be reflected therefrom, absorbed therein or let through, for instance.

In various embodiments, such as shown in FIG. 1, the multilayer structure 100 may further comprise a plastic, optionally thermoplastic, layer 104 produced, optionally molded, such as injection molded, or cast, upon the substrate film 102 and embedding at least portion of the number of functional elements 110, 112, 114 and/or of the structural tuning element 116 therewithin.

In some embodiments, such as shown in FIG. 1, the multilayer structure 100 may comprise a second substrate 106, such as a second substrate film, arranged to the opposite side of the plastic layer 104 relative to the substrate film 102. In such embodiments, the plastic layer 104 may be produced, optionally molded, such as injection molded, or cast, between the substrate film 102 and the second substrate 106, and embedding at least portion of the number of functional elements 110, 112, 114 and/or of the structural tuning element 116 therewithin.

Still further, a first connection 108, such as arranged in wired manner, e.g., providing an electrical connection, or wirelessly, e.g., by wireless electrical, optoelectrical, or optical means, may be arranged to extend through or across the plastic layer 104. Optionally, the first connection 108 may be configured to connect or to provide a connection between at least one functional element 110, 112, 114 or any element on the substrate film 102, and the second substrate 106, such as with a functional element thereon.

As mentioned above, the substrate film 102 may comprise a 3D, optionally thermoformed or otherwise (e.g., during the process of using or manufacturing of the multilayer structure 100 induced) non-flat shape 103. The shape 103 induced may be essentially permanent (molded, drilled, cut or e.g. thermoformed shape) or temporary (remain while an external force is subjected to the structure 100 or element such as the film 100 thereof, for example). The structural tuning element 106 may be configured to control the deformation of the substrate film 102 within a proximity of the 3D non-flat shape, preferably comprising the control over the distribution of deforming forces in selected directions, for example, as shown in FIG. 1 by the tangent line 118 or slope 118 of the surface of the substrate film 102 substantially at the position or transition area 103B of the non-flat shape 103.

The substrate film 102 and optional second substrate film 106 utilized may refer to a rigid or flexible (and bendable) substrate film in which one (e.g. z, such as "thickness") of the three dimensions is significantly shorter with respect to the other two (e.g. x and y) dimensions, for example. Thus, the substrate film 102, 106 may, at least originally, be an essentially planar or a planar-like substrate. However, the substrate film 102, 106 may, either originally or after processing such as 3D-forming (e.g. thermoforming) generally or locally define 3D shape(s) 103, e.g. curved or bent shape(s).

In various embodiments, the substrate film 102, 106 may comprise or consist of material(s) such as plastics, e.g. thermoplastic polymer, and/or organic or biomaterials with reference to e.g. wood, leather or fabric, or a combination of any of these materials with each other or with plastics or polymers or metals. The substrate film 102 may comprise or consist of thermoplastic material. The thickness of the film may vary depending on the embodiment; it may only be of few tens or hundredths of a millimeter, or considerably thicker, in the magnitude of one or few millimeter(s), for example.

The substrate film 102 and, optionally, also the second substrate (film) 106, may, for example, comprise at least one material selected from the group consisting of: polymer, thermoplastic material, electrically insulating material, PMMA (Polymethyl methacrylate), Poly Carbonate (PC), copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above. If there is the second substrate 106, it may differ from the first substrate film 102 in terms of dimensions, shapes, and/or material(s), for example.

As also mentioned hereinbefore, in various embodiments material(s) of the substrate film 102, 106 and/or of further layer(s) may at least partially be optically substantially opaque or at least translucent having regard to predefined wavelengths e.g. in visible spectrum. This is also applicable to the plastic layer 104, for example, being molded or cast. The concerned element such as a film type substrate, coating or other layer, optionally defining at least portion of the exterior (surface) of the multilayer structure 100, or being at least visible or otherwise perceivable therethrough, may have been provided with a number of visually distinguishable, decorative/aesthetic and/or informative, features such as graphical pattern and/or color thereon or therein. The features may have been provided on the same side of the substrate film 102 with the functional elements 110, 112, 114 so that they have been also at least partially sealed, or on the opposite side and thus may or may not be sealed by the material of the plastic layer 104 through the associated overmolding, for instance. Accordingly, IML (in-mold labeling)/IMD (in-mold decoration) technique is applicable. The used materials may be at least partially, i.e. at least in places, optically substantially transparent to radiation such as visible light emitted by the electronics thereon. The transmittance may be about 80%, 85%, 90%, 95% or higher, for example.

Referring to the plastic layer 104, it may comprise thermoplastic and/or thermosetting material(s). Thickness of the molded or otherwise produced layer(s) may vary depending on the embodiment. It may be, for example, in the order of magnitude of less than one, one, few or tens of millimeters. The material(s) may be e.g. electrically insulating. The layer may comprise at least one material selected from the group consisting of: elastomeric resin, thermoset material, thermoplastic material, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

In various embodiments, selected features including also e.g. graphics, coloring or other visual features may be provided on internal surfaces or layers of the structure 100. Accordingly, different impacts, rubbing, chemicals, etc. that could easily damage e.g. painted, printed or mounted surface features do not affect or reach the embedded/non-surface features. Relating covering layers such as film(s) or the elastic (fill) material(s) may be manufactured or processed, optionally cut, carved, etched or drilled into a desired shape with necessary characteristics such as holes or notches for exposing the underlying features such as material layers or e.g. electrical elements to a selected extent to the environment.

Various examples of the structural tuning element 116, referring either to a single element or a group of constituent elements jointly establishing the tuning element 116 from a functional standpoint, are being described in the following. The examples may describe properties of the structural tuning element 116 which may exist explicitly or in combination with one or several of the properties described in connection with other of said examples.

The structural tuning element 116 in accordance with various embodiments of the present invention may comprise at least one element selected from the group consisting of: mechanical element, optically functional element, printed electronics technology-provided element, electrically insulating element, electrically conductive element, printed electronics-provided electrically insulating element, printed electronics-provided electrically conductive element, additively produced element, sputtered element, deposited element, vacuum deposited element, etched element, additively produced electrically conductive element, additively produced electrically insulating element, carved element, thinned or thickened portion of a greater element such as of an electrically conductive element or an electrically insulating element, cavity, recess, through-hole, subtractively, or by a subtractive method, produced element, subtractively produced electrically conductive element, subtractively produced electrically insulating element, physical extension of an electrically conductive element such as conductor trace or contact pad, physical extension of an electrically insulating element such as insulator fill or electrical crossover insulation layer, and optically functional such as transmissive, refractive, diffractive, opaque, absorptive, scattering or reflective element.

In various embodiments, the structural tuning element 116 may, preferably, be located in contact with or adjacent, preferably in close vicinity, to at least one of the number of functional elements 110, 112, 114. In FIG. 1, for example, the structural tuning element 116 at the illustrated transition area 103B is in contact or at least adjacent to the element 110.

In various alternative or additional embodiments, the structural tuning element 116 may be configured to locally limit, reduce or increase deformation of the substrate film 102. In FIG. 1, for example, the structural tuning element 116 is arranged adjacent to the element 110 in order to locally stiffen the substrate film 102. Therefore, when the shape of the substrate film 102 is being changed, that is deformed, such as shown on the left in FIG. 1, the structural tuning element 116 prevents or at least reduces the amount of deformation of the substrate film 102 at the transition area 103B (marked with an ellipse having a dashed line) related to the shape 103. For example, if in FIG. 1 there would be no structural tuning element 116 on the substrate film 102 on the left, the tangent line 118 would deviate even more from horizontal (i.e. the slope/gradient would be higher), that is the deformation would cause more severe stress on the element 110, possible even detaching or breaking it during the deformation of the substrate film 102.

In various alternative or additional embodiments, the structural tuning element 116 may be configured to limit, reduce or increase the slope 118 of deformation as stated hereinbefore, for example. Alternatively or in addition, the structural tuning element 116 may limit, reduce or increase the magnitude of changes in the slope 118. Still further, alternatively or in addition, the structural tuning element 116 may shift the deformed area 103B, or shape the deformed area 103B. Alternatively or in addition, the structural tuning element 116 may limit, reduce or increase the magnitude of deformation 103, and/or extend or reduce the length of the transition area 103B or transition between the transition area 103B and neighboring, optionally substantially flat, substrate portion.

Yet, the functional element or elements may include e.g. a sub-assembly with an own substrate ("sub-substrate") and elements such as electrical or specifically electronic components hosted by the (sub-)substrate. An example of this is illustrated in FIG. 2 including an electrically functional node component 110, 210 which may be regarded as a whole as a functional element 110.

Figure 2:
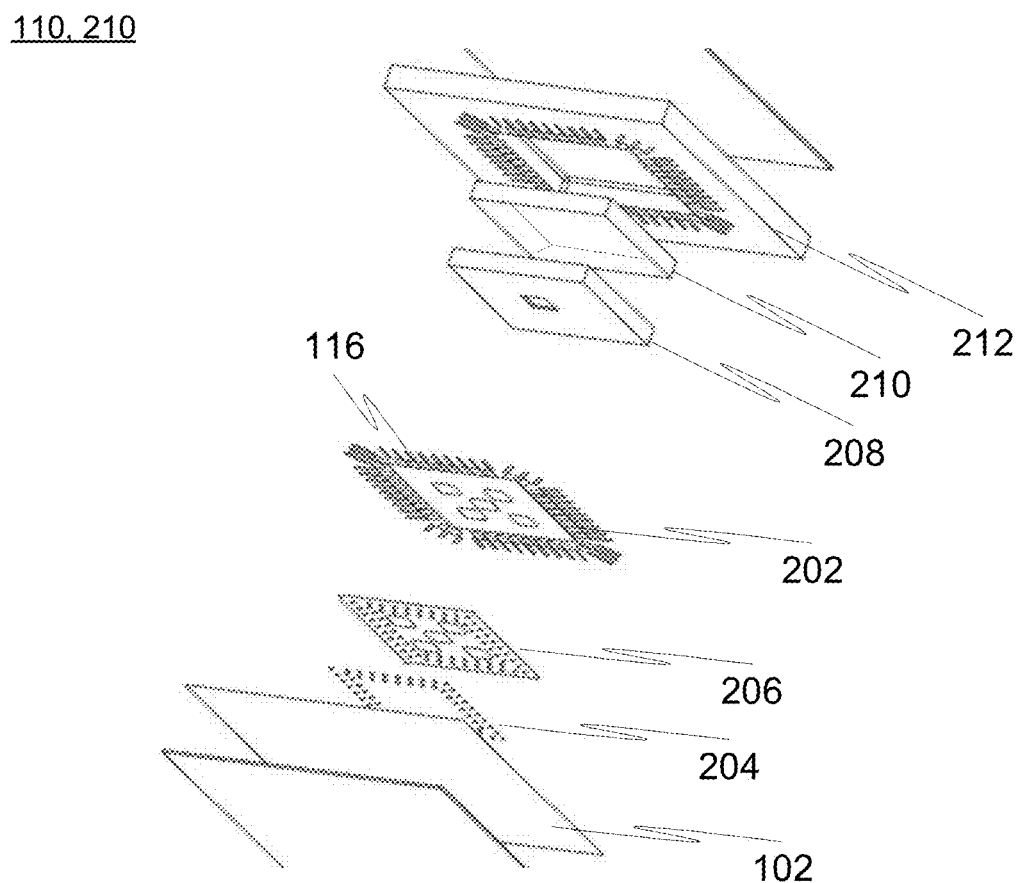
FIG. 2 illustrates an embodiment of a potential element, in this example specifically a functional such as electrically functional node type component, to be disposed on a substrate film of the multilayer structure.

FIG. 2 illustrates an embodiment of a potential functional element 110, in this example specifically a functional, such as an electrically functional, node component 210, to be disposed on a substrate film 102 of the multilayer structure 100. In FIG. 2, an exploded view of an embodiment of the node 110, 210 is being illustrated. The node 110, 210 may comprise, for example, function elements, such as electronics, on the substrate film 102 (potentially multi-layer), a first material layer 208 or a fill material 208, a shell 210, protective pattern 202, such as a print, underfill 206, and electrical contacts 204. Optionally, at least one portion or even entire node 110, 210 may be enclosed or embedded, such as protected, by a plastic layer 104, 212, such as injection molded plastic layer. The layer 212 may be of thermoplastic material, for instance.

In FIG. 2, e.g. the protective pattern or print 202 may comprise, at least as a part thereof, at least a portion of the structural tuning element 116 in accordance with some embodiments of the present invention. The protective pattern 202 on the substrate film 102 may thus comprise, such as on the peripheral portion(s) of the pattern 202 structural tuning elements 116 which may comprise an elongated shapes. The structural tuning element 116 may be, for example, configured to locally limit, reduce or increase deformation of the substrate film 102, such as close to the connector pins of the electrical node 110, 210.

In various embodiments, the first material layer 208 may define at least portion of the exterior surface of the node 110, 210. However, as being appreciated by a person skilled in the art, the first material layer 208 may be covered, at least in places, i.e. selectively, by further material(s) such as a selected coating or film layer, or especially upon installation in a host structure, e.g. on a host substrate, by optionally thicker material layer 212, such as that may be molded or cast, for instance, over the node 110, 210.

A substrate film 102 utilized for the node 210 or a related host structure, as already contemplated hereinbefore, may refer to a rigid or flexible substrate in which one (e.g. z, such as "thickness") of the three dimensions is significantly shorter with respect to the other two (e.g. x and y) dimensions, for example. Typically, the substrate film is made of or provided with electrically insulating material.

In various embodiments, the hardness of at least one material of the first material layer 208 may preferably be about 85 or less on Shore scale A or about 40 or less on Shore scale D, for example.

In various embodiments, the modulus of elasticity of at least one material of the first material layer 208 is preferably about 2000 MPA or less, more preferably about 500 MPA or less, and most preferably about 100 MPA or less.

Accordingly, relatively soft material (low(er) hardness and/or low(er) modulus of elasticity) may be applied as at least one component of the first material layer 208 (e.g. base or filler) if not constituting it substantially fully.

In various embodiments, the first material layer 208 may be adherent to a preferably flowable/flowing and further preferably thereafter solidified, preferably plastic, material that is subsequently provided in contact with the first material layer and optionally selected from the group consisting of: thermoplastic material, polymeric or alike material, lignin or alike material, TPU, polymer, elastomeric material, PC, PMMA, ABS, PET, PA (polyamide), GPPS, PCPA (pentachlorophenyl acrylate), cellulose based thermoplastic material, and MS resin. The plastic material may be molded or cast, for instance, upon the first material layer and the node in general.

In various embodiments the first material layer 208 may be adherent to material that is subsequently provided in contact with the first material layer 208 and optionally selected from the group consisting of: metal, wood, solid wood, veneer, plywood, bark, tree bark, birch bark, cork, leather, fabric or textile, natural leather, natural textile or fabric material, textile material, cotton, wool, linen, silk, formable material, thermoformable material, cold-formable material, epoxy, multi-component epoxy, ink, and conductive ink.

In various embodiments, the first material layer 208 may be selected and/or processed so as to be adherent to a material of the substrate film 102 and/or of said at least one functional or specifically, electrical element, the concerned material preferably comprising at least one material selected from the group consisting of: polymer, conductive polymer, thermoplastic material, organic material, elastomeric material, electrically insulating material, PMMA (Polymethyl methacrylate), Poly Carbonate (PC), polyimide, a copolymer of Methyl Methacrylate and Styrene (MS resin), glass, organic material, fibrous material, Polyethylene Terephthalate (PET), metal, wood, solid wood, veneer, plywood, bark, tree bark, birch bark, cork, (natural) leather, (natural) textile or fabric material, textile material, cotton, wool, linen, silk, formable material, thermoformable material, cold-formable material, gold, copper, tin, silver, palladium, solder resist, thermally curable solder resist, UV curable solder resist, epoxy, lignin or alike material, cellulose based material, multi-component epoxy, ink, and conductive ink.

In various embodiments, the first material layer 208 may comprise or consist of material associated with a coefficient of thermal expansion (CTE) falling in a range between about 1 and 300 ppm/K, more preferably between about 10 and 200 ppm/K, and most preferably between about 25 and 80 ppm/K. Thermal expansion characteristics such as coefficients of certain materials may vary considerably depending on the temperature, which shall be acknowledged by a person skilled in the art while considering the applicability of various materials in terms of such characteristics and in the light of probable temperatures the concerned material is eventually subjected to when the associated node is in use or storage, for example. Similar considerations apply to material elasticity.

In various embodiments, the first material layer 208 may comprise composite material and/or a number of fillers in a host material, the first material layer optionally comprising or consisting of multiple sub-layers, and/or said first material layer comprises mutually different constitutions of material, preferably organized in sub-layers, having characterizing functional properties such as refractive indexes or other optical characteristics to establish a selected optical functionality.

In various embodiments, the first material layer 208 may comprise or essentially consist of thermally conductive material, said thermally conductive material being optionally provided in the form of one or more fillers. A filler material could be mixed, e.g. as particles, with other, potentially dominant material(s) of the first material.

In various embodiments, the first material layer 208 may comprise or essentially consist of optically, having regard to selected wavelengths optionally including visible light, essentially transparent and/or colorless material that is substantially preferably chemically inert to discoloration when exposed to heat or high-energy photons. The material(s) of the first material layer 208 may additionally or alternatively have various other desired characteristics, either locally or generally, in terms of e.g. electrical conductivity (conductive/insulating, whereupon desired electrically conductive features such as conductors or shields for e.g. the embedded electronics, or insulating features could be implemented therefrom, considering e.g. metal materials such as silver or copper).

Yet, in some embodiments the material of the first material layer 208 may be used for photon down- or up conversion. The material could be at least locally luminescent. It could be then applied as a scintillator excited by radiation, for example. Accordingly, e.g. a radiation detector could be manufactured. Still, the first material layer could be configured and used for dissipation or amplification of electromagnetic field, thermal conduction or insulation, and/or light diffusion (or alternative light control) among other options.

The first material layer 208 may comprise e.g. base (host) material and filler(s) to achieve the desired functionalities. In various embodiments, the substrate film 102 may comprise at least one element selected from the group consisting of: planar piece of substrate material, printed circuit board, rigid printed circuit board, flexible printed circuit board, FR4 based circuit board, ceramic electrical substrate (e.g. HTCC or LTCC; that is, high or low temperature cofired ceramic), multilayer circuit board, 3D-formed such as thermoformed substrate, additively manufactured (3D printed) single or multilayer circuit board, additively manufactured circuit board comprising both electrically insulating and conductive material, multilayer substrate, film substrate, flexible film substrate, 3D-formed substrate, thermoformed substrate, molded substrate, injection molded substrate, extruded substrate, thermoformable substrate, thermoplastic substrate, polymer substrate, printed film substrate and patterned conductive polymer substrate.

In various embodiments, the node may comprise or at least thermally if not physically couple to a thermal management element, optionally cooling or heating element, further optionally comprising at least one element selected from the group consisting of: a heat sink, a thermal slug, and a thermal well.

In various embodiments, the first material layer defines, generally concerning the first material layer or the node as a whole, or locally in one or more places, essentially at least one shape, such as a cross-sectional shape, selected from the group consisting of: rectangle, trapezoid, frustum, isosceles trapezoid, isosceles trapezoid with shorter base facing the substrate film, isosceles trapezoid with longer base facing the substrate film, rounded shape, rounded rectangle, rounded isosceles trapezoid, triangle, rounded tri-angle, semicircle, dome, convex, bell-shape, mushroom-shape, conical, semi-ellipse, and droplet or column shape.

In various embodiments, the at least one functional or specifically e.g. at least partially electrical element comprises at least one element selected from the group consisting of: electronic component, integrated circuit, electromechanical component, active component, passive, component, electrical conductor, printed electrical conductor, printed electronics-produced electrical conductor, electrode, contact pad, conductor trace, electro-optical (or optoelectronic) component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micro-mechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, microelectromechanical (MEMS) component, UI element, user input element, vibration element, sound producing element, communication element, transmitter, receiver, transceiver, antenna, resonator, wireless communication element, wireless tag, radio tag, tag reader, data processing element, data storage or memory element, and electronic sub-assembly.

In various embodiments, the node 210 may comprise a second substrate on a side of the first material layer 208 that is opposite to a side facing the substrate film 102 and at least one functional, such as electrical element, thereon, wherein the second substrate is optionally configured for attaching the electrical node to a host structure or specifically host sub-strate thereof. Accordingly, the (first) substrate and the second substrate may establish a stacked structure having e.g. electronics and at least portion of the first material layer 208 therebetween.

Figure 3:
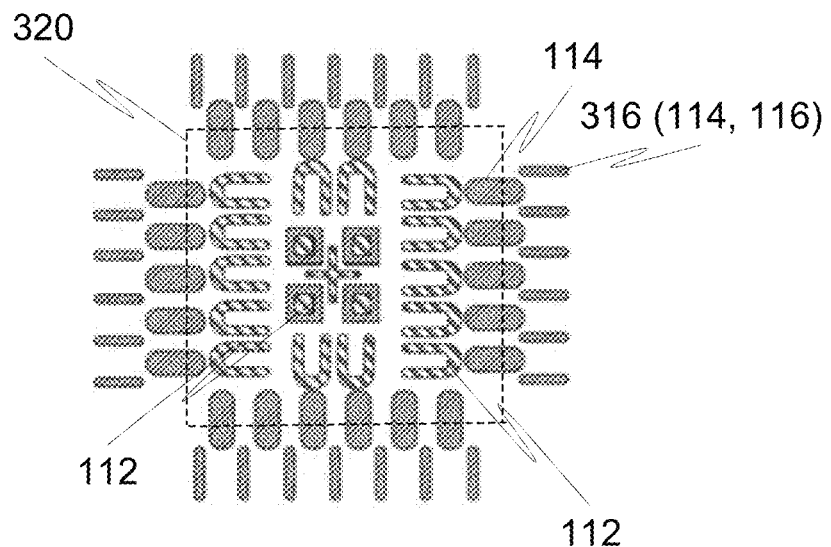
FIG. 3 illustrates an embodiment of a structural tuning element in accordance with the present invention.

FIG. 3 illustrates, at 300, an embodiment of a structural tuning element 316 or (a group of) elements 316 in accordance with the present invention. In FIG. 3, an example of a pattern of tuning elements 316, preferably of electrically insulating material or insulator fill, which is designed to gradually make the deformation of the substrate film 102 locally easier when starting from the center area 320 over or onto which a larger component, such as an electrical node, may be coupled to, which is typically substantially non-deformable, and proceeding to the rest of the film. Together with insulator elements 114, the elements 316 establish a gradually sparsening structure of electrically insulating material. The structural tuning elements 316 are configured to or at least intended to prevent tearing of the conductors (shown as having a U-shape in FIG. 3), which are fanned out from the center area 320, and are susceptible when thermoformed. As can be seen, in this case the structural tuning elements 316 may have, however not limited to, an elongated shape, for instance.

Figure 4:
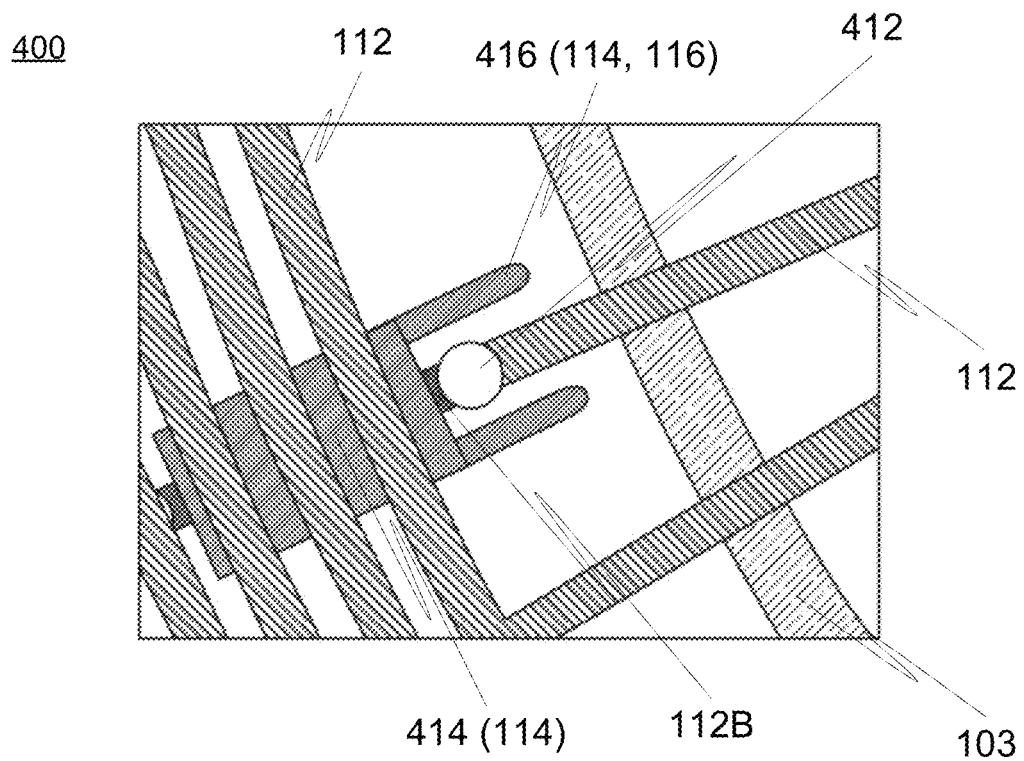
FIG. 4 illustrates an embodiment of a structural tuning element that can be provided in connection with e.g. crossover and/or joint structures on a substrate.

FIG. 4 illustrates an embodiment of a structural tuning element 416 that may be established in connection with e.g. crossover and/or joint structures 400, for example, on a substrate film 102.

In various embodiments, there may be arranged, e.g. by printing, a conductive element 112B from conductive ink on the substrate film 102 and below e.g. a printed insulator element 414. The conductive element 112B may be configured to connect (associated joint is shown as a circle 412 in the fig.) to other conductive element such as a conductor trace 112 of e.g. printed nature and potentially established from conductive ink as well. The materials of conductive elements 112B, 112 may the same or different. The conductive material used in one or more crossover region elements such as the conductive element 112B may in some embodiments be more brittle than the one used in the trace 112, for example. Furthermore, there may, optionally, be arranged other conductors or functional elements in the crossover structure that are not explicitly shown.

There is additionally shown an embodiment of a structural tuning element 416, produced e.g. by printing material on the substrate, however not limited to printing, to make the deformation transient of the shape 103 that is affected by e.g. crossover insulator 414 less severe, and/or move the deformation shape 103 away from the most sensitive part of the crossover structure, such as the joint 412. The tuning element 416 may comprise electrically insulating material, for instance. The tuning element 416 may be actually established as extension(s) or protrusion(s) of the crossover insulator 414, or provided separately therefrom (thus essentially as multiple/two (constituent) elements 416). Accordingly, the electrical joint 412 may be protected by the surrounding ("horn") elongated element portions 416.

The structural tuning element(s) 416 may be thus arranged adjacent to the crossover insulator 414, which extends or shifts the deformation transient away from the more brittle crossover ink 112B or related joint 412, and optionally towards more flexible conductive ink 112. The elongated structural tuning elements 416, are configured to extend beyond more vulnerable element(s), thus controlling, such as limiting, the deformation at the vulnerable element(s).

In various embodiments the structural tuning element 416 may comprise a first material that is stiffer and preferably also more tear resistant, or vice versa, than second material of the substrate, of any material layer thereon, or of any of the functional elements. For instance, electrically insulating printed material such as insulating ink may be stiffer and more tear resistant than a conductive printed material such as crossover area conductive ink as deliberated above.

Yet, the structural tuning element(s) 416 may be used to limit deformation, when using large, potentially in-molded components, modules and/or electrical nodes. In the case of e.g. nodes, there is also a drastic change of rigidity of the substrate film 102 at the edge of potentially additionally underfilled component/module, causing large transient of film 102 due to stretching during processing such as thermoforming. In case of having accompanied a layer of conductive ink, this also in turn is in danger to tear. In case of stretching due to deformation, for example, the structural tuning element(s) 416 may be arranged to be thinner in the portions beyond the vulnerable element(s).

The structural tuning element 416 as shown in FIG. 4 may be utilized to mitigate problems with crossover insulator boundaries near drastic radius in surface contour because the deformation may cause the conductors, for instance, such as of conductive ink, which typically is quite brittle compared to normal conductive ink, to tear in immediate vicinity of crossover structure. The structural tuning element 416 may be arranged to be more resistant to stretching, thus causing a transient in deformation at its edges, in places where the crossover structure ends and the conductor at the crossover is arranged to connect to another conductor extending outside the crossover structure.

Figure 5:
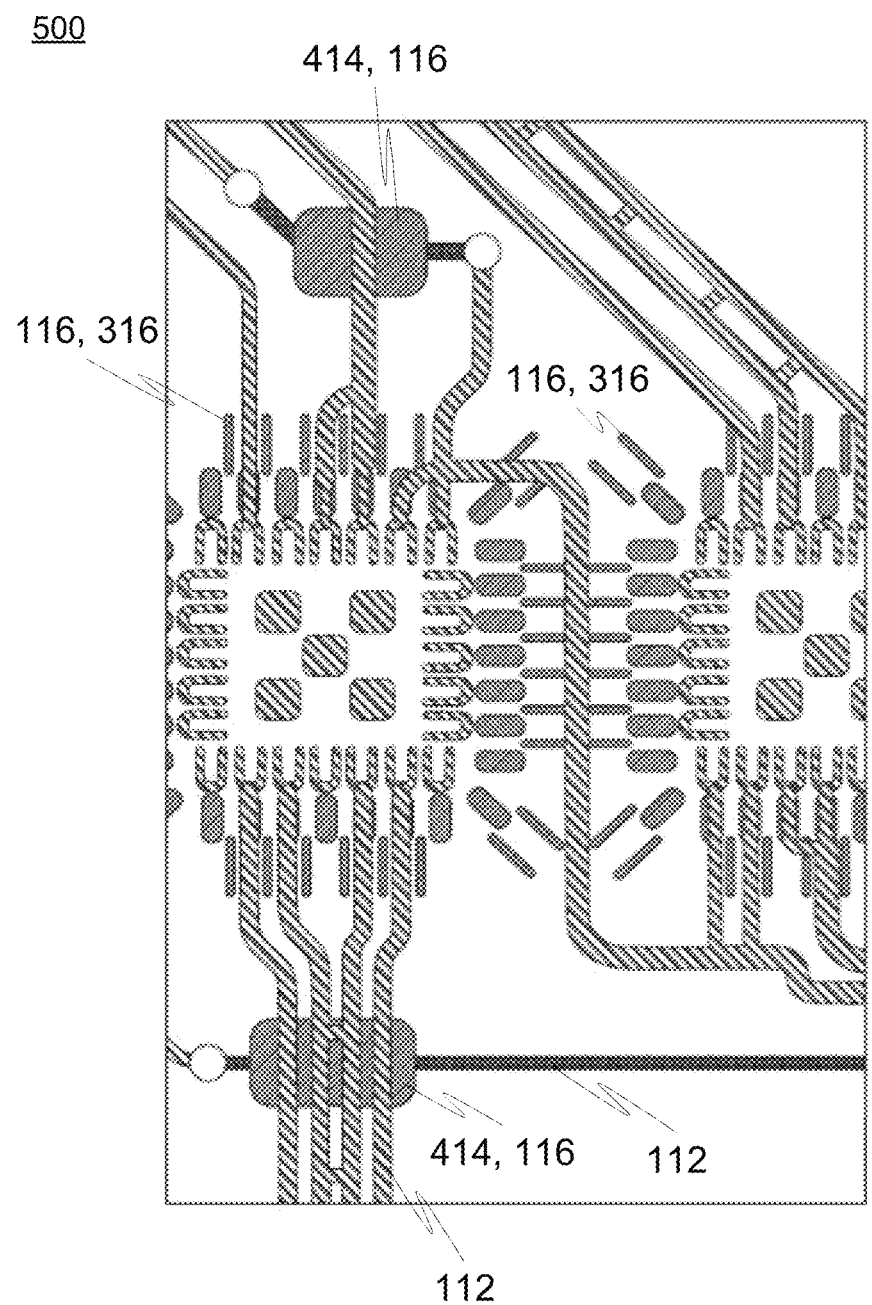
FIG. 5 illustrates a circuit design provided on a substrate for receiving electronic components and providing electrical connections therebetween.

FIG. 5 illustrates a circuit design 500 provided on a substrate 102 for receiving electronic components and providing electrical connections therebetween. As can be seen, the circuit design 500 may comprise a structural tuning element 316 or elements 316, such as groups of elements, as illustrated e.g. in FIG. 3 and/or in the crossover/joint structure 400 as shown in FIG. 4.

A plurality of structural tuning elements 116, 316 may be arranged on the substrate film 102 to control the deformation of the substrate film 102 in the desired manner. This may entail moving the transition areas 103B or deformation shapes 103 farther away from, or at least making them less severe in, the vicinity of vulnerable elements, such as larger components, e.g. electrical nodes or crossover joints. The structural tuning elements 116 may have substantially any shape, however, elongated shapes may be advantageous in many cases.

Figure 6:
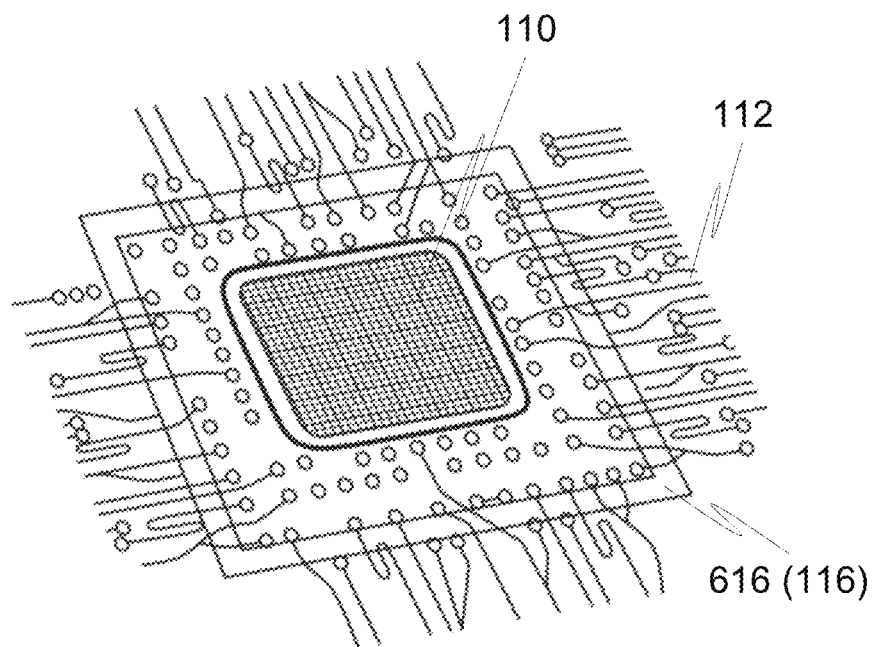
FIG. 6 illustrates an embodiment of a structural tuning element in connection with a functional element such as an electronic component.

FIG. 6 illustrates, at 600, an embodiment of a structural tuning element 616 in connection with a functional element 110 such as, but not necessarily, an electronic component such as a semiconductor component. The functional element 110 may be, for example, a microcontroller, transceiver, RF amplifier, etc.

In various embodiments of the multilayer structure 100, the substrate film 102 may be processed, e.g. by thermoforming or injection molding (e.g. overmolding), during the manufacture thereof or utilized afterwards in a fashion (twisted, for example), which cause deformation.

The functional element 110 such as the node or an integrated circuit may, in general, comprise a number of components which may optionally have a common casing, for instance, with multiple pads, wires and/or traces leaving or connecting to the casing, such as in the scenario shown in FIG. 6. In various embodiments, the functional element 110 and related elements such as wiring/traces may be protected from deformation. This may be done by using various materials, e.g. silver conductive inks, dielectric inks, color inks, and SMD glues that have a characteristic to limit the elongation of a substrate film 102, such as a thermoplastic or urethane film substrate or other substrates mentioned hereinbefore.

For instance, the functional element 110, and optionally related other elements such as mounting pads and/or section of connecting traces 112, may be arranged to be protected within a boundary zone or frame defined by the structural tuning element 616 of selected material(s) such as the ones mentioned above. The deformation, such as elongation, may thus be minimized or at least reduced within the frame/zone to secure component mounting and e.g. (electrical) performance.

The tuning element 616 may comprise or consist of a merely or at least mostly circumferential, encircling material entity (border, edge or wall type of an entity), which at least partially surrounds the functional element 110. The element 616 may thus have an empty or hollow center or generally hollow internal area(s) or volume(s). Alternatively, in addition to encircling portions, also the internal areas of the element 616 may have been provided with the associated tuning material thus resulting in a more if not essentially a fully filled type of a frame or zone structure.

The tuning element 616 may be provided on the substrate 102 and/or the element 110 to be protected by printing, mounting and/or (over)molding, for instance. In some embodiments, the tuning element 616 may be or at least contain a piece of film or other material that has been locally provided on the substrate film 102. In some embodiments, the boundary zone as shown in FIG. 6 can be prepared or reinforced during e.g. injection molding by using a plurality, such as two or more, different materials that together will transition dynamic subsequent elongation to take place primarily outside the protected boundary zone.

By various embodiments of the tuning element 616 and in connection with e.g. stretchable products like wearables, fabric sensors etc. the shapes 103, caused by e.g. dynamic stretching of the substrate film 102, may be kept limited if not fully prevented within the boundary zone/frame 616. In other words, within a boundary zone the elongation of the materials may remain modest in order to secure component mounting, trace connectivity and electrical performance. Outside the boundary area, in turn, dynamic stretching can occur to a greater extent, preferably still within the limits of the used conductors, such as conductive inks, and other components thereat, which may in some cases be designed so as to sustain applicable elongation.

Figure 7:
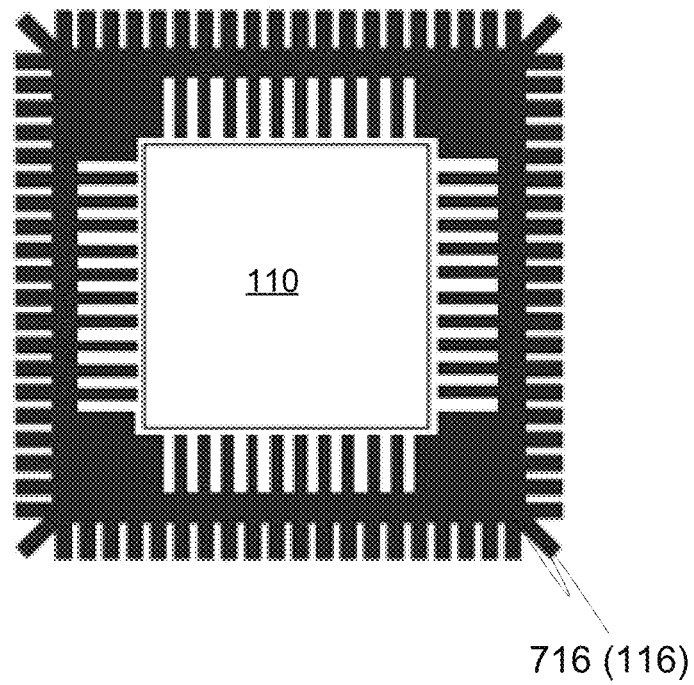
FIG. 7 illustrates an embodiment of a structural tuning element.

FIG. 7 illustrates, at 700, an embodiment of a structural tuning element 716 that may again define or contain a frame, whereupon considerations given hereinelsewhere e.g. in relation to FIG. 6 are generally also applicable now, and vice versa.

In FIG. 7, functional elements 110, such as a standard TQFP (thin quad flat package) and/or other moderate contact density IC packages for use in IMSE structures may be provided to the structure, typically upon the substrate film 102. Such packages can include, but are certainly not limited to QFN (quad flat no-leads), SSOP (shrink small outline package) and TDFN (thin dual flat no leads). According to an embodiment, a TQFP may be considered especially advantageous functional element 110 since they often have manageable contact density and the contact pads can thus be reliably printed.

A material barrier structure provided e.g. by the tuning element 716 may be configured to create a more rigid area on the substrate film 102 which limits, for example, local stretch during forming of the film 102, thus protecting the contained element(s) such as functional element 110. In various embodiments, the tuning element 716 may be utilized, for example, to spread interface stress over a longer gradient (slope), thus reducing risk for conductor breakage at the normally sharply discontinuous interface. Furthermore, contact material volume and contact surface area can also be dramatically increased due to greatly reduced risk of short-circuit since the barrier provided by the element 716 may be utilized in blocking, for example, flow of solder adhesive or other conductive materials. Still further, the outer edge of the barrier structure may be designed to have stress relief features such as fins or a thickness gradient, depending on the particular embodiment.

In some embodiments, the element 716 may comprise e.g. a snap-on type frame, for example, for TQFP-like packages or other, especially component-type functional elements 110, in which case conductive material may be dispensed from the above leads after element mounting. In an embodiment, a pre-prepared frame may be snapped onto the element and the combined assembly is then mounted onto the substrate film 102 with a few drops of adhesive, for instance, under the element. Additionally, spacers may be arranged, such as printed, under the structure to ensure easy flow of e.g. capillary underfill. A viscous conductive adhesive may then be dispensed over the component leads. The viscosity prevents the material from flowing under the frame, however, it can make a very large-area contact with the component leads and the exposed part of the underlying printed pad. Further still, the entire structure may be underfilled with a low-viscosity capillary underfill and potentially glob topped/edge globbed.

In various other embodiments, e.g. printed confinement structure type of a frame may be provided e.g. with "pools" on pads that direct flow outwards during mounting of a target functional element 110 such as QFN or SSOP type component package. In some embodiments, e.g. a thick, such as about 15 or 20 μm thick (or thicker), printed frame may be produced on the substrate film 102. The conductive adhesive may be dispensed, for example, generously, onto the pads and the element pressed on to the frame. Excess adhesive, if any, will flow outwards, away from areas where it can cause short-circuits. In some cases, the printed frame may wet poorly with the conductive adhesive, if the adhesive has excellent adhesion to metal pads and the underlying printed contact pads. This may further help confine the spread of adhesive and allow capillary wetting of the component pads. The frame confines flow of conductive adhesive to only occur outwards when the component is pressed onto it and if there is any spillage, pressing the component into its place will sever the contact by displacing the adhesive. The frame material preferably has at least some degree of elasticity for this to work reliably. In some embodiments, the printed frame may be produced or arranged with flow channels for application of further underfilling with a capillary underfill.

Still, a pre-mounted deep plastic frame or printed confinement structure may be provided on the substrate film 102 (dispensing over pads, component mounting afterwards). The pads may thus be isolated with a barrier tall enough to block adhesive flow and spatter during mounting of element 110 (component). The frame may be produced by cutting suitable shape from a thin plastic sheet and securing it on the substrate film 102 with adhesive. Alternatively, the frame structure can simply be printed on the substrate film 102. If there are (electrical) insulator materials that are in any case provided on the substrate 102, these may be also used for this purpose, whereupon it may not even be necessary to execute additional process stages to create the frame.

The provided frame may also be used to confine the spread of any glob-topping materials used.

Yet, in various embodiments, the barrier structure can be configured to confine the spread of a capillary underfill material applied to the element 110, reducing risk of the material ending up where it should not. Depending on the confining structure's height, it may also be possible to cap the structure, completely sealing the element 110 into a flexible volume of filler, for instance.

In the light of the foregoing, the structural tuning elements 716 or other features of the multilayer structure may be thus configured to define barrier or confinement structures that protect e.g. electrical contacts from stretching during processing such as (thermo)forming. This allows using almost any heat-resistance conductive adhesives.

Furthermore, the barrier structure enables confining the spread of e.g. underfill and glob-top, both of which are commonly required while using larger component packages in hard resins, such as PC or PMMA. Using these materials in softer injection resins is still advisable, as they help eliminate air traps from under, around and between components, for example.

Yet, the frame from which various structural tuning features (e.g. spikes or teeth) may extend from, whether printed or pre-cut, may be arranged to facilitate embedding of certain more difficult elements, such as flat inductors, as they can be neatly and repeatably filled with a low-viscosity underfill material within the pool formed by the frame. This can enable, for example, LED drivers being embedded within the plastic. In some embodiments, e.g. a micromodule structure may comprise components directly mounted on the substrate film 102 using the frame described hereinbefore and then filled in together within the same frame and/or glob-top. In various embodiments, copper and solder-based modules, or directly coupled components may be utilized.

Figure 8:
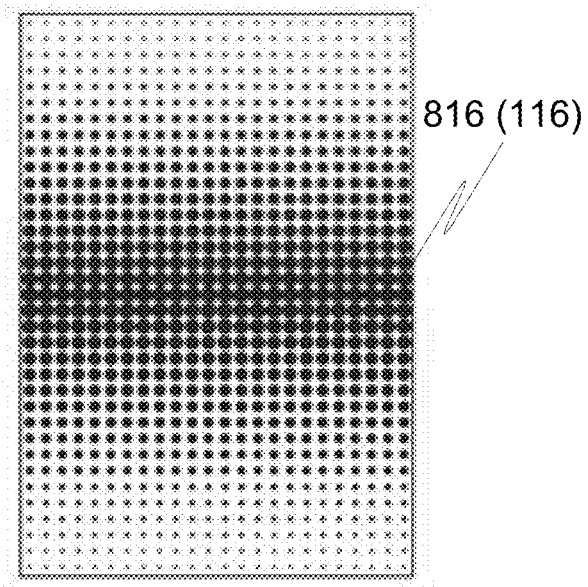
FIG. 8 illustrates an embodiment of a gradient type pattern for use as a structural tuning element and/or otherwise functional element, such as optically functional element.

FIG. 8 illustrates, at 800, an embodiment of a gradient type pattern for use as a structural tuning element 116, or a group or groups of such elements, and/or otherwise functional element(s) 110, such as optically functional element(s).

The gradient type pattern, which may be used e.g. as a light guiding or coupling pattern in addition to or instead of structural tuning, may be easily produced in automated manner, such as by printing. The pattern of structural tuning element 816 as shown in FIG. 8, conveniently provides the desired control such as the control of the deformation of the substrate film 102 by gradually varying the printed features, such as density and/or size of the printed elements, such as dots, of the pattern.

Figure 9:
FIG. 9 illustrates a further embodiment of a patterned structural tuning element.

FIG. 9 illustrates, at 900, a further embodiment of a patterned structural tuning element 916, which may find use, besides in electrical structures such as antennae/radiators and electromagnetic shields, also in various other (non-electrical) structures wherein larger surface areas are generally provided with stiff material (e.g. ink printed) and subjected to forces inducing deformation, e.g. (thermo) forming. The patterned structural tuning element 916 may be used to control of the deformation of the substrate film 102. The patterned structural tuning element 916 may comprise e.g. a printed a chevron-like structure, which can be used to alter deformation mechanism e.g. in a hatch structure. In a typical hatch structure there are long, straight lines of provided, optionally printed, material such as electrical conductor or insulator lines, which forces almost all deformation to stretch the concerned material, which may be even more troublesome in terms of material breakage than other deformation mechanisms, such as shearing and/or bending. As can be seen in FIG. 9, the patterned structural tuning element 916 does not contain any continuous long and straight stretches of conductor material (or other materials, the nature of provided pattern material(s) depending on the use case as deliberated above) in any given direction extending across the whole area of FIG. 9, e.g. a target area, thus limiting the amount of actual stretching imposed to the conducting ink or other pattern shapes-providing material, while allowing more room for the intermediate empty areas of substrate film, to stretch. Accordingly, by the shown-like type of a structure, material deformation such as stretch may be conveniently focused to those intermediate substrate areas lacking the (printed) pattern features.

The patterned structural tuning element 916 may comprise a plurality of elements defining a discontinuous pattern at the target area. Yet, the patterned structural tuning element 916 may alter the deformation from stretching action to bending and shearing instead while still allowing some stretching and compression in order to conform to shapes that in a normal process would result in wrinkles. In various embodiments, several different geometries may be contemplated to achieve this kind of more malleable hatch structure.

Figure 10:
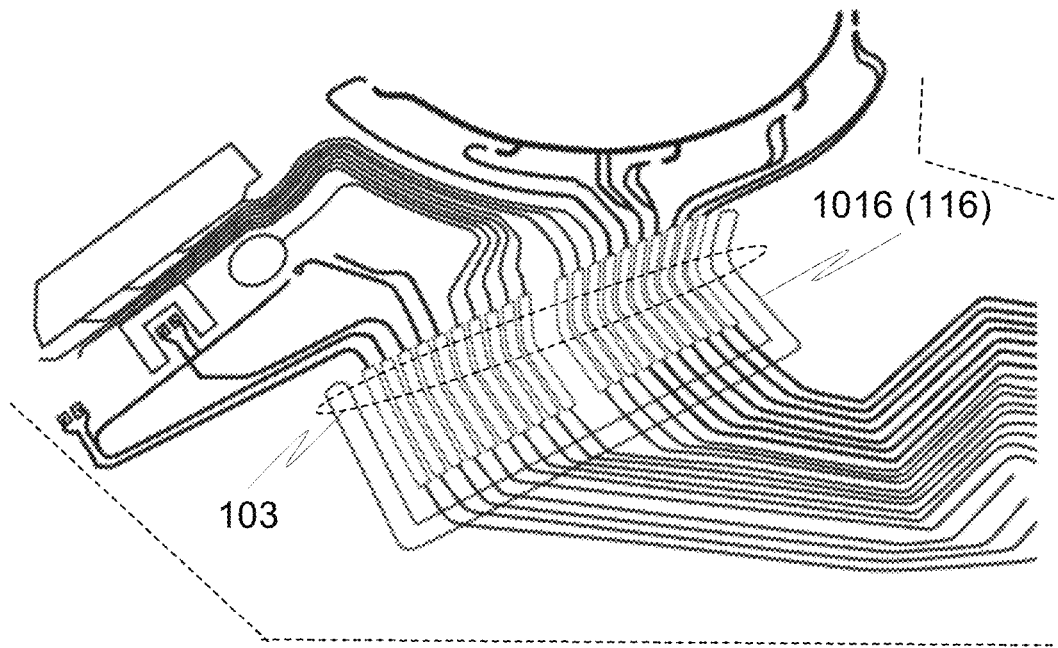
FIG. 10 illustrates a use case of an embodiment of a structural tuning element in connection with a three-dimensional substrate and overall structure.

FIG. 10 illustrates a use case of an embodiment of a structural tuning element 1016, e.g. a (printed) frame, in connection with a three-dimensional substrate, for example deformed substrate film, and overall structure 1000. As can be seen, the structural tuning element 1016 may be arranged to control the deformation at the position of the connecting elements. The structural tuning element 1016 advantageously prevents too severe a deformation occurring at the position of the vulnerable parts.

Figure 11:
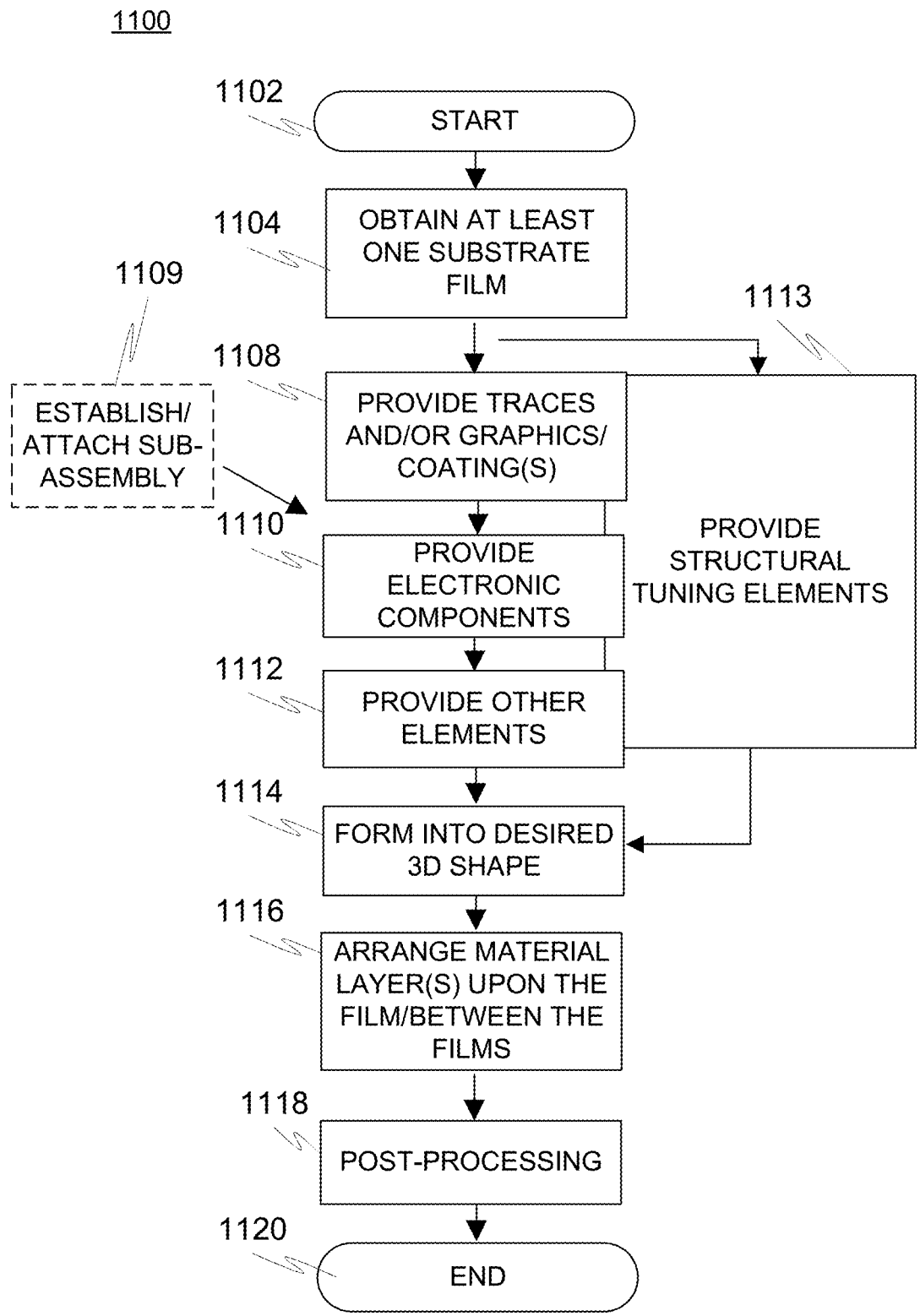
FIG. 11 is a flow diagram of an embodiment of a method in accordance with the present invention.

FIG. 11 is a flow diagram 1100 of an embodiment of a method in accordance with the present invention. At the beginning of the method for manufacturing a multilayer structure 100, a start-up phase 1102 may be executed. During start-up, the necessary tasks such as material, for example substrates, component and tools selection, acquisition, calibration and other configuration tasks may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding/IMD (in-mold decoration), lamination, bonding, (thermo)

forming, electronics assembly, cut-ting, drilling and/or printing equipment, among others, may be thus ramped up to operational status at this stage.

Step 1104 may refer to obtaining a substrate film comprising formable, optionally thermoformable, material.

Step 1108, 1109, 1110, 1112 may refer to providing a number of functional elements, including at least one functional element, on the substrate film. Step 1109 may refer to providing an electrical node or sub-assembly as a functional element on the substrate film.

At step 1113, the substrate film may be further provided, preferably within a proximity of any of said functional elements, with a structural tuning element configured to locally control process-inducible deformation of the substrate film. This step may be performed prior to, simultaneously, or after any or all of the steps 1108, 1109, 1110, 1112. Furthermore, the structural tuning element may be arranged to control the deformation of the substrate film within a proximity of the three-dimensional non-flat shape, preferably comprising the control over the distribution of deforming forces during the non-flat shape-inducing deformation of the substrate film. The structural tuning element may be provided to the substrate film utilizing, for instance, at least one technique selected from the group consisting of: additive manufacturing technique, printing preferably utilizing a selected printed electronics technology, mounting, sputtering, deposition, and subtractively processing such as etching, cutting or carving the substrate film or an element thereon.

In various embodiments, the method may further comprise, preferably after step 1113, forming 1114 the substrate film to exhibit a selected deformation, optionally comprising three-dimensional non-flat shape, in the proximity of the functional elements. The forming 1114 may include thermoforming, vacuum forming, high pressure forming, or cold forming, for instance.

In various embodiments, the method may comprise producing 1116, preferably by molding, such as injection molding, or casting, at least one plastic layer upon the substrate film, at least partially embedding one or more of the functional elements and/or the structural tuning element therewithin.

Still further, in various embodiments, the method may comprise post-processing 1118 of the multilayer structure 100. This may mean, for example, cutting certain parts thereof, cutting it, installing it to a host device, or other known post-processing tasks appreciated by a skilled person.

At 1120, method execution is ended.

Figure 12:
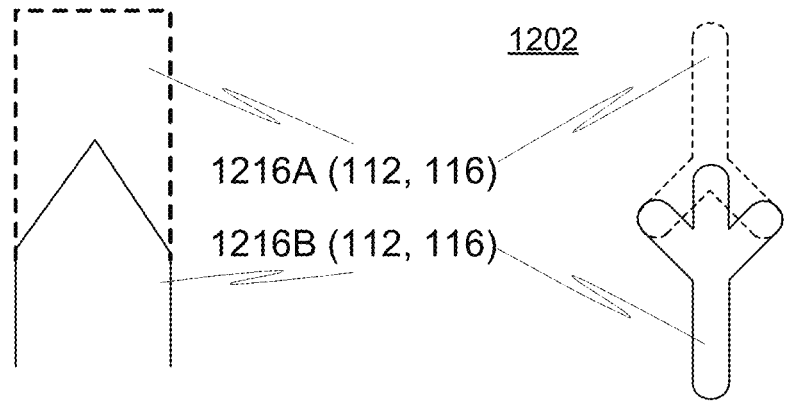
FIG. 12 illustrates two embodiments for structural tuning and related tuning elements in connection with material or element transitions or joints.

FIG. 12 illustrates, at 1200, material transition such as (conductive) ink transition and related joint between two elements 1216A (broken line) and 1216B (solid line), which may represent electrical conductors, for instance. Instead of an abrupt step-type transition, the joint involves a gradual type of a longer switchover or gradient between materials as provided by the shown element shapes 1216A, 1216B and positioning in the joint area. The joint area is thus generally enlargened and the structure made more resistant to deformation such as stretching. The contacting edge areas of the elements 1216A, 1216B may thus be considered to establish structural tuning elements in the shown scenario.

At 1202, there is provided redundancy in the form of multiple, slightly distinct joint locations between the spread-out elements 1216A and 1216B via the associated node and branch portions. Obviously, the solutions of scenarios 1200 and 1202 may also be combined.

Figure 13:
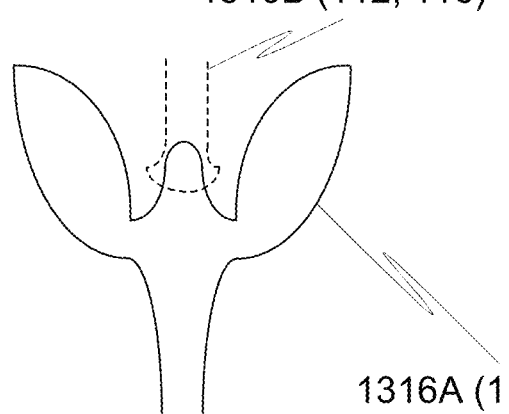
FIG. 13 illustrates an embodiment of a structural tuning element in connection with a joint structure of two elements such as conductors.

FIG. 13 illustrates a further embodiment of a structural tuning element in connection with a joint structure 1300 of two elements such as conductors. In FIG. 13, the two elements may be of same or different material, preferable electrically conductive material or conductive traces. However, as can be seen, the first of two elements 1316A may be adapted such that it has extending portions or extensions (that is integrated structural tuning elements) which extend to surround and thus protect the joint 1300 between the two elements relative to the deformation (deformation at the actual location of the joint may be thus reduced or omitted). The extensions may generally stiffen the structure. The second of the two elements 1316B may thus merely be connected to said first of the elements 1316A or may, additionally, also be adapted to comprise such protecting shapes or integrated structural tuning elements. The material of the element 1316A may in some embodiments be, for example, stiffer than the material of element 1316B.

The scope of the present invention is determined by the attached claims together with the equivalents thereof. A person skilled in the art will appreciate the fact that the dis-closed embodiments were constructed for illustrative purposes only, and other arrangements applying many of the above principles could be readily prepared to best suit each potential use scenario.

The invention claimed is:

1. An integrated functional multilayer structure, comprising:
a substrate film having a first portion having a substantially flat shape, a second portion having a three-dimensional, non-flat shape, and a transition area interconnecting the first and second portions;
a number of functional elements provided upon the substrate film, wherein at least one of the functional elements being provided in proximity of or over the transition area of the substrate film; and
a structural tuning element positioned over the transition area of the substrate film to locally stiffen the substrate film at the transition area of the substrate film more than at the second portion of the substrate film having the three-dimensional, non-flat shape, the structural tuning element including a printed ink.

2. The integrated functional multilayer structure of claim 1, further comprising a plastic layer produced upon the substrate film and including at least a portion of the number of functional elements and/or of the structural tuning element embedded therewithin.

3. The integrated functional multilayer structure of claim 1, wherein the structural tuning element is positioned to control a distribution of deforming forces in selected directions.

4. The integrated functional multilayer structure of claim 1, wherein the structural tuning element is located in contact with or adjacent to at least one of the number of functional elements.

5. The integrated functional multilayer structure of claim 1, wherein the structural tuning element is configured to locally limit, reduce or increase deformation of the substrate film.

6. The integrated functional multilayer structure of claim 1, wherein the structural tuning element is configured to limit, reduce or increase a slope of deformation; limit, reduce or increase a magnitude of changes in the slope of deformation; shift a deformed area; shape the deformed area; limit, reduce or increase a magnitude of deformation;

and/or extend or reduce a length of deformed area or transition between the deformed area and a neighboring portion of the substrate film.

7. The integrated functional multilayer structure of claim 1, wherein the printed ink is stiffer and more tear resistant than a second material of the substrate film, of any material layer thereon, or of any of the functional elements.

8. The integrated functional multilayer structure of claim 1, wherein the structural tuning element comprises an electrically insulating element or an electrically conductive element configured to reduce and/or shift away deformation-caused slope and/or the transition area of the substrate film at a location of at least one functional element of the number of functional elements.

9. The integrated functional multilayer structure of claim 1, wherein the structural tuning element comprises at least a portion configured to extend towards a maximum of deformation or related slope from the functional elements.

10. The integrated functional multilayer structure of claim 1, wherein the structural tuning element comprises at least one element selected from the group consisting of: mechanical element, optically functional element, printed electronics technology —provided element, electrically insulating element, electrically conductive element, printed electronics—provided electrically insulating element, printed electronics —provided electrically conductive element, additively produced element, sputtered element, deposited element, vacuum deposited element, etched element, additively produced electrically conductive element, additively produced electrically insulating element, carved element, thinned or thickened portion of a greater element including of an electrically conductive element or an electrically insulating element, cavity, recess, through-hole, subtractively produced element, subtractively produced electrically conductive element, subtractively produced electrically insulating element, physical extension of an electrically conductive element, physical extension of an electrically insulating element, and transmissive, refractive, diffractive, opaque, absorptive, scattering or reflective elements.

11. The integrated functional multilayer structure of claim 1, wherein the structural tuning element comprises at least a portion of a frame circumferential to any of the functional elements on the substrate film.

12. The integrated functional multilayer structure of claim 1, wherein the structural tuning element is further configured to direct, limit or prevent a flow of material disposed in a flowable state on the substrate film or any of the functional elements so as to remain within a circumferential boundary zone defined by the structural tuning element.

13. The integrated functional multilayer structure of claim 1, wherein the structural tuning element comprises a frame connected or at least adjacent to at least one functional element of the number of functional elements.

14. The integrated functional multilayer structure of claim 1, wherein the structural tuning element defines a guiding structure for flowable material, the guiding structure being configured to enable the flowable material, in its flowing state, to contact with a functional element of the number of functional elements.

15. The integrated functional multilayer structure of claim 1, wherein the structural tuning element comprises a mechanical stress relief structure comprising a plurality of fins, teeth and/or gradually expanding or reducing extension shapes.

16. The integrated functional multilayer structure of claim 1, wherein the structural tuning element comprises a pattern defined by or at least incorporating a plurality of non-linear or only piece-wise linear and/or non-continuous shapes, wherein an area span by the pattern defines an electromagnetic shielding or radiating structure.

17. The integrated functional multilayer structure of claim 1, wherein the structural tuning element comprises a pattern with a number of repeating geometric shapes a size and/or other characteristic of which is gradually altered in the pattern, or a diffuser pattern with substantially uniform shapes.

18. The integrated functional multilayer structure of claim 17, wherein the pattern is configured for light directing, processing or coupling relative to the substrate film or an element thereon.

19. The integrated functional multilayer structure of claim 1, the functional elements are selected from the group consisting of optical elements, mechanical elements, opto-electrical elements, electrical elements, and electronic elements.

20. The integrated functional multilayer structure of claim 19, wherein the functional elements are electronic elements, the electronic elements selected from the group consisting of conductors, insulators, electrical components, and integrated circuits.

21. The integrated functional multilayer structure of claim 1, wherein the structural tuning element has an elongated shape or a circumferential shape.

22. The integrated functional multilayer structure of claim 1, wherein the structural tuning element is configured to locally control stretching, bending, compression, and/or shearing of the substrate film within the proximity of the selected shape.

23. The integrated functional multilayer structure of claim 1, wherein the structural tuning element is part of a plurality of structural tuning elements, the plurality of structural tuning elements arranged about a predetermined area, wherein at least a first structural tuning element of the structural tuning elements has a different dimension than a second structural tuning element of the plurality of structural tuning elements, and wherein the first and second structural tuning elements are positioned to establish a gradual sparsening structure that facilitates gradual local deformation of the substrate film in a direction extending away from the predetermined area.

24. The integrated functional multilayer structure of claim 23, wherein the gradual sparsening structure includes electrically insulating material.

25. The integrated functional multilayer structure of claim 23, wherein the gradual sparsening structure includes electrically conductive material.

26. The integrated functional multilayer structure of claim 1, wherein the structural tuning element encircles the number of functional elements such that the structural tuning element defines a hollow center in the structural tuning element.

27. The integrated functional multilayer structure of claim 1, wherein the structural tuning element is not positioned over the second portion of the substrate film.

* * * * *